United States Patent
Laroche

(10) Patent No.: US 6,442,581 B1
(45) Date of Patent: Aug. 27, 2002

(54) LATTICE STRUCTURE FOR IIR AND FIR FILTERS WITH AUTOMATIC NORMALIZATION

(75) Inventor: Jean Laroche, Santa Cruz, CA (US)

(73) Assignee: Creative Technologies Ltd., Singapore (SG)

( * ) Notice: Subject to any disclaimer, the term of this patent is extended or adjusted under 35 U.S.C. 154(b) by 0 days.

(21) Appl. No.: 09/399,969

(22) Filed: Sep. 21, 1999

(51) Int. Cl.$^7$ .............................................. G06F 17/10
(52) U.S. Cl. ..................................................... 708/318
(58) Field of Search .............................. 708/300, 318, 708/319, 320

(56) References Cited

U.S. PATENT DOCUMENTS 4,825,396 A  *  4/1989  Gazsi ........................... 708/318
4,884,230 A  * 11/1989  Gielis et al. ................. 708/318
5,249,205 A  *  9/1993  Chennakeshu et al. ..... 375/348

OTHER PUBLICATIONS

Jon Dattorro, *The Implementation of Recursive Digital Filters for High–Fidelity Audio*, Nov. 1988, J. Audio Eng. Soc., vol. 36, No. 11, pp 851–878.

A. H. Gray, Jr. and John D. Markel, *Digital Lattice and Ladder Filter Synthesis*, Dec. 1973, IEEE Transactions on Audio and Electroacoustics, vol. AU–21, No. 6, pp 491–500.

Augustine H. Gray, Jr. and Hohn D. Market, *A Normalized Digital Filter Structure*, Jun. 1975, IEEE Transactions on Acoustics, Sppech, and Signal Processing, vol. ASSP–23, No. 3, pp 268–277.

John D. Market and Augustine H. Gray, Jr., *Fixed–Point Implementation Algorithms for a Class of Orthogonal Polynomial Filer Structures*, Oct. 1975, IEEE Transactions on Acoustics, Sppech, and Signal Processing, vol. ASSP–23, No. 5, pp 486–494.

Dana C. Massie, *An Engineering Study of the Four–Multiply Normalized Ladder Filter*, Jul./Aug. 1993, J. Audio Eng. Soc., vol. 41, No. 7/8, pp 564–582.

* cited by examiner

Primary Examiner—Chuong Dinh Ngo
(74) Attorney, Agent, or Firm—Townsend and Townsend and Crew LLP

(57) ABSTRACT

Apparatus providing a "reverse lattice" structure for IIR and FIR filters, which exhibits desirable scaling properties at no additional computational or memory cost. The reverse lattice structure implementation of an IIR filter scales down signals at sections corresponding to reflection coefficients close to 1 in magnitude. This feature provides automatic scaling for poles lying close to the unit circle which would otherwise produce large amplification factors.

10 Claims, 4 Drawing Sheets

LATTICE STRUCTURE FOR IIR AND FIR FILTERS WITH AUTOMATIC NORMALIZATION

FIELD OF THE INVENTION

This invention relates generally to the field of signal processing, and more particularly, to a method and apparatus for filtering a signal using a lattice structure.

BACKGROUND OF THE INVENTION

Lattice and ladder implementations of IIR and FIR filters have been in use for many years, for example, in speech synthesis/coding applications or to simply implement equalizing filters. The stability of these filters is preserved by the linear interpolation of their coefficients, which makes them quite attractive for filters whose coefficients must vary from frame to frame, such as in speech coding.

However, lattice filters are not immune from scaling problems which can occur, for example, when poles are close to the unit circle. In this case, signals are subjected to a high level of amplification, which can result in saturation or clipping. This is especially bothersome when implementing equalizing or shelving filters, where high bandwidths are often desirable. Many strategies have been tried to avoid the scaling problems that arise when using lattice filters. Unfortunately, these strategies have resulted in the use of additional multipliers, which increase the processing cost of the filters.

Thus, it would be desirable to have a lattice structure which could be used in IIR and FIR applications to overcome problems associated with scaling, while requiring no increases in processing costs.

SUMMARY OF THE INVENTION

The present invention provides a method and apparatus which include a "reverse lattice" structure for implementing IIR and FIR filters. The reverse lattice structure implementation of an IIR filter exhibits desirable scaling properties at no additional computational or memory cost, by scaling down signals at filter sections corresponding to reflection coefficients close to 1 in magnitude. This feature provides automatic scaling for poles lying close to the unit circle which would otherwise produce large amplification factors.

In one embodiment a reverse lattice structure is provided for processing an input signal to form an output signal. The reverse lattice structure comprises: a means to scale the input signal to form a scaled input signal; a means to delay a first feedback signal and to form a delayed feedback signal; a means to combine the delayed feedback signal with the scaled input signal to form a second feedback signal; a means to scale the second feedback signal to form a third feedback signal; and a means to combine the input signal and the third feedback signal to form the output signal.

In another embodiment, a method is provided for processing an input signal to form an output signal. The method begins by receiving the input signal and scaling the input signal to form a scaled input signal. Next, a feedback signal is received. The feedback signal is delayed to form a delayed feedback signal. The scaled input signal and the delayed feedback signal are combined to form an adjusted feedback signal, which is scaled to form a scaled adjusted feedback signal. Finally, the input signal and the scaled adjusted feedback signal are combined to form the output signal.

Other features and advantages of the present invention will be understood upon reading and understanding the detailed description of the preferred exemplary embodiments, found hereinbelow, in conjunction with reference to the drawings, in which like numerals represent like elements.

DESCRIPTION OF THE SPECIFIC EMBODIMENTS

The present invention provides a "reverse lattice" structure for implementing IIR and FIR filters. The reverse lattice structure requires the same number of additions, multiplications and delay memories as standard lattice structures, but has the added advantage of applying automatic scaling dependent on the values of the filter coefficients. In particular, for IIR filters, the automatic scaling counteracts the undesirable amplification brought about by poles close to the unit circle and also helps to prevent unwanted signal clipping.

Figure 1:
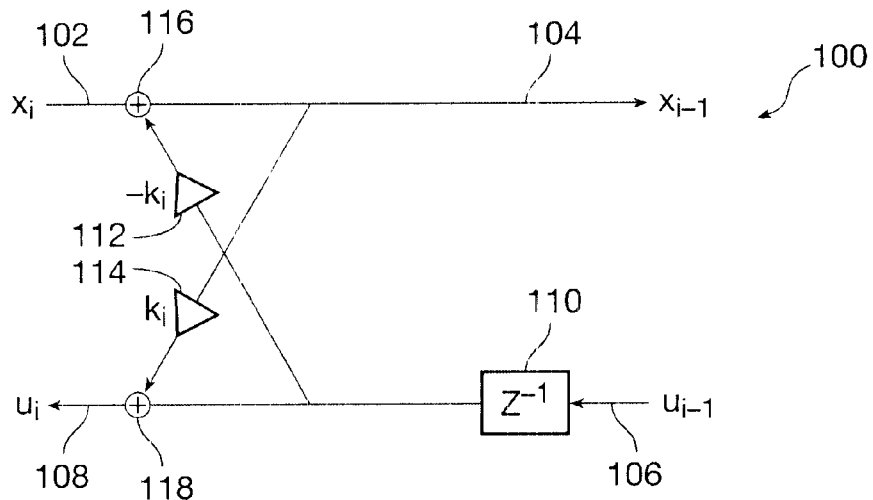
FIG. 1 is a prior art lattice section.

FIG. 1 is a prior art lattice section 100 sometimes referred to as a standard lattice section. The standard lattice section 100 has four terminals shown as input 102, output 104, feedback in 106 and feedback out 108. The four terminals of the standard lattice section 100 allow additional lattice sections to be connected so that a multi-section filter can be created. The input 102 and output 104 terminals are on a feed forward branch and the feedback in 106 and feedback out 108 terminals are on a feedback branch. Also included in the standard lattice section 100 are signal delay 110, signal amplifiers 112, 114 and summing nodes 116 and 118.

The signal amplifiers 112 and 114 are used to form crisscross signal paths, which allow signals from the feed forward branch to cross over and combine with signals in the feedback branch and signals from the feedback branch to cross over and combine with signals in the feed forward branch. For example, a signal at the feedback in 106 terminal is delayed by the signal delay 110 and then input to the signal amplifier 112. The output of the signal amplifier 112 is provided to the feed forward branch and is combined with the input signal at summing node 116 to form the output signal at the output 104. Likewise, an output signal at output 104 is input to the amplifier 114 and the output of the amplifier 114 is provided to the feedback branch to be summed with the delayed feedback signal at summing node 118. The output of summing node 118 forms the feedback out 108 signal.

The Z-transforms of the input and output of the standard lattice section 100 can be expressed in matrix form as:

$$\begin{bmatrix} X_i(z) \\ U_i(z) \end{bmatrix} = \begin{bmatrix} 1 & k_i z^{-1} \\ k_i & z^{-1} \end{bmatrix} \begin{bmatrix} X_{i-1}(z) \\ U_{i-1}(z) \end{bmatrix} = M_i \begin{bmatrix} X_{i-1}(z) \\ U_{i-1}(z) \end{bmatrix}$$

and assuming $M_i$ is non-singular, may further be expressed as:

$$\begin{bmatrix} X_{i-1}(z) \\ U_{i-1}(z) \end{bmatrix} = M_i^{-1} \begin{bmatrix} X_i(z) \\ U_i(z) \end{bmatrix} \quad (1)$$

Figure 2:
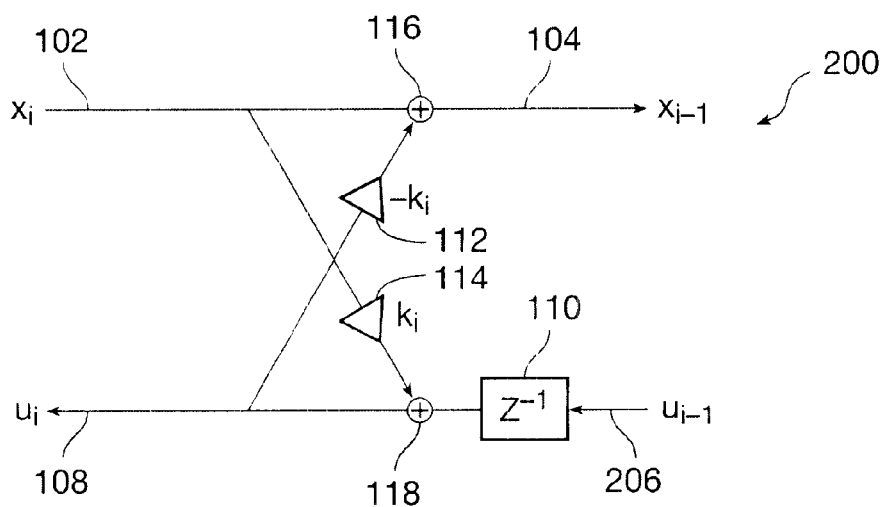
FIG. 2 is a reverse lattice section constructed in accordance with the present invention.

FIG. 2 shows a reverse lattice section 200 constructed in accordance with the present invention. In the reverse lattice section 200, the signal amplifiers 112, 114 form reverse criss-cross signal paths between the feed forward and feedback branches as compared to the standard lattice structure 100. The Z-transforms of the input and output of the reverse lattice section can be expressed in matrix form as:

$$\begin{bmatrix} X_i(z) \\ U_i(z) \end{bmatrix} = \frac{1}{1-k_i^2} \begin{bmatrix} 1 & k_i z^{-1} \\ k_i & z^{-1} \end{bmatrix} \begin{bmatrix} X_{i-1}(z) \\ U_{i-1}(z) \end{bmatrix} = \frac{1}{1-k_i^2} M_i \begin{bmatrix} X_{i-1}(z) \\ U_{i-1}(z) \end{bmatrix}$$

and assuming $M_i$ is non-singular, may further be expressed as:

$$\begin{bmatrix} X_{i-1}(z) \\ U_{i-1}(z) \end{bmatrix} = (1-k_i^2) M_i^{-1} \begin{bmatrix} X_i(z) \\ U_i(z) \end{bmatrix} \quad (2)$$

Comparing equations (1) and (2) reveals that signals on the right-hand side of equation (2) representing the reverse lattice section 200 are scaled by a normalizing factor $(1-k_i^2)$, but are otherwise identical to the standard lattice section 100. As a result, the transfer function of a filter having multiple sections of the reverse lattice structure will be identical to the transfer function of the filter using the standard lattice structure, but in addition, will be scaled by the product of the normalizing factors associated with each section. Equation (3) demonstrates this relationship by expressing the reverse lattice transfer function $H_r(z)$ of a filter comprising multiple sections of the reverse lattice structure 200, where p is the number of reverse lattice sections in the filter and $H_s(z)$ is the transfer function of the same filter implemented using the standard lattice structure 100, as follows:

$$H_r(z) = \left[ \prod_{i=0}^{P} (1-k_i^2) \right] H_s(z) \quad (3)$$

Figure 3:
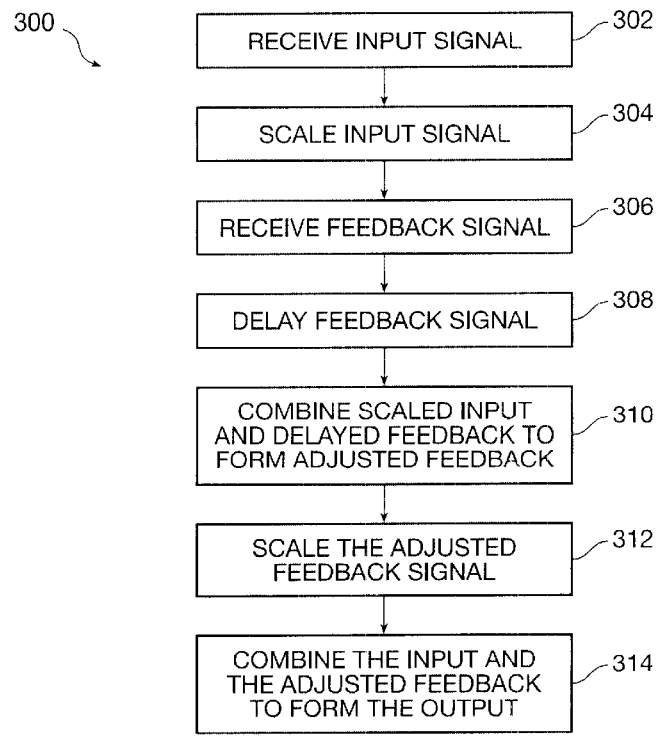
FIG. 3 is a method for processing an input signal in accordance with the present invention.

FIG. 3 shows a method 300 for processing an input signal in accordance with the present invention. The method 300 provides signal processing corresponding to the processing achieved by a filter implemented with one or more sections of the reverse lattice structure 200. At block 302, an input signal is received for processing in accordance with the method 300. At block 304, the input signal is scaled to produce a scaled input signal. Scaling may be accomplished by amplifying, attenuating or performing other scaling techniques on the input signal. For example, scaling is shown in FIG. 2 at the amplifier 114 where the input is scaled by the value $k_i$.

At block 306, a feedback signal is received. The feedback signal may be obtained from the output of the current section or derived from the feedback branch of subsequent filter sections. At block 308, the feedback signal is delayed. For example, if the input signal is a sequence of digitized samples, the delay may correspond to one or more sample time periods.

At block 310, the scaled input signal and the delayed feedback signal are combined to form an adjusted feedback signal. Combining may occur by simply adding the signals together, as done at summing node 118. The adjusted feedback signal forms the feedback out 108 signal as shown in FIG. 2.

At block 312, the adjusted feedback signal is scaled thereby forming a scaled adjusted feedback signal. The scaling may comprise amplifying, attenuating or other scaling technique. In FIG. 2, the scaling is accomplished when amplifier 112 scales the adjusted feedback signal by the value $k_i$. At block 314 the scaled adjusted feedback signal is combined with the input signal, as done at summing node 116, to form the output signal.

The method 300 may be performed once, corresponding to a single reverse lattice section filter, or may be expanded to implement a multisection reverse lattice filter wherein the output of the final stage forms the initial feedback signal that propagates to previous stages via the feedback branch.

Figure 4:
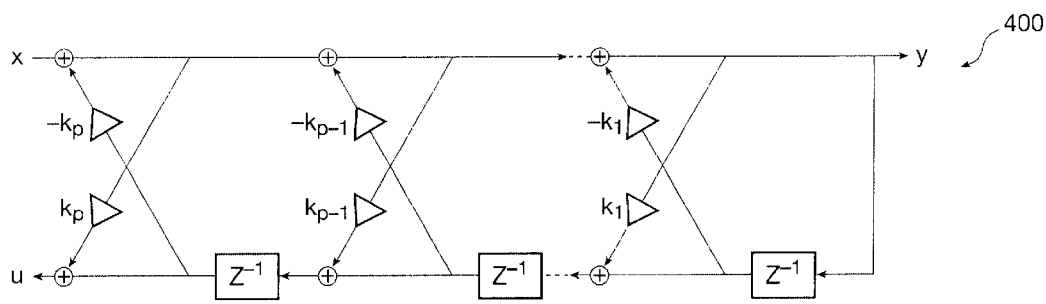
FIG. 4 is a prior art lattice structure implementation of an IIR filter.

FIG. 4 shows a prior art IIR filter 400 implemented with the standard lattice structure 100. The transfer function for the IIR filter 400 can be expressed as:

$$H_s(z) = \frac{1}{A(z)} = \frac{1}{1 - a_1^P z^{-1} - \cdots - a_P^P z^{-P}} \quad (4)$$

where p is the number of sections in the filter. The coefficients $\alpha_i^P$ of the polynomial $A(z)$ can be obtained from the reflections coefficients $k_i$ via a known process referred to as Levinson recursion wherein:

$$a_i^i = k_i$$

$$a_{i-j}^i = a_{i-j}^{i-1} + k_i a_j^{i-1} \quad 1 \le j < i$$

$$a_i^0 = 1$$

which must be applied for i=1 ... p. Thus, the IIR filter 400 is a purely recursive filter with no zeros and no input or output scaling.

Figure 5:
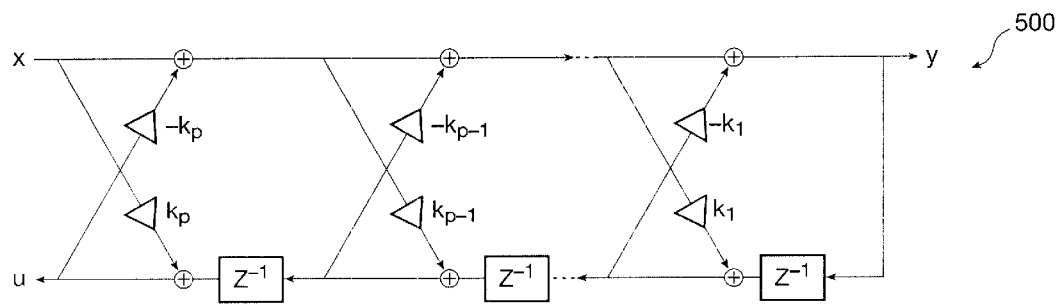
FIG. 5 is a reverse lattice structure implementation of an IIR filter constructed in accordance with the present invention.

FIG. 5 shows a reverse lattice IIR filter 500 constructed in accordance with the present invention. The reverse lattice IIR filter 500 is obtained by using multiple sections of the reverse lattice section 200, wherein the criss-cross signal paths are reversed with respect to the standard lattice section 100.

Based on equation (3), the transfer function of multiple sections of the reverse lattice structure 500 can be expressed as:

$$H_r(z) = \frac{\prod_{i=0}^{P}(1-k_i^2)}{A(z)} = \left[ \prod_{i=0}^{P} (1-k_i^2) \right] H_s(z) \quad (5)$$

which is the transfer function of the filter, if constructed using the standard lattice, multiplied by corresponding normalization factors. Reversing the criss-cross signal paths introduces the normalization factors, but does not modify the recursive structure of the filter.

The scaling factor $$\prod_{i=0}^{P} (1-k_i^2)$$

in the transfer function is distributed over all the sections that compose the filter. Thus, the signals in the feed forward branch and the feedback branch of the lattice IIR filter 500 are scaled at the output of section i by $(1-k_i^2)$. These scaling factors counteract the large signal amplification that results from having near unity reflection coefficients (i.e. $k_i \approx \pm 1$ for some i). In such cases, the term $(1-k_i^2)$ becomes smaller as the magnitude of $k_i$ approaches 1.

To illustrate the scaling benefits achieved by the reverse lattice structure, an all pole second order filter section implemented in both standard and reverse lattice structures will be discussed. This example will demonstrate how the reverse lattice structure exhibits approximate normalization with respect to the resonance gain of the filter.

For the standard lattice implementation, the transfer function of the filter can be expressed in terms of the radius r and the pole angle $\pm \omega_0$, as well as in terms of the reflection coefficients $k_1$ and $k_2$, via the Levinson recursion. The transfer function of the standard lattice structure forming a second order filter can be expressed as:

$$H_s(z) = \frac{1}{1 - a_1 z^{-1} - a_2 z^{-2}}$$

and substituting the radius r and pole angle $\pm \omega_0$ yields:

$$H_s(z) = \frac{1}{1 - 2r\cos\omega_0 z^{-1} + r^2 z^{-2}} \text{ and ;} \quad (6)$$

$$H_s(z) = \frac{1}{1 + k_1(1 + k_2)z^{-1} + k_2 z^{-2}} \quad (7)$$

where it is assumed that the second order filter has two complex conjugate poles. From equations (6) and (7) above it can be shown that $k_1$ and $k_2$ can be expressed as:

$$k_1 = \frac{-2r\cos\omega_0}{1 + r^2}$$

and $k_2 = r^2$

It is a standard result that for the transfer function of equation (6), the gain at the true resonance frequency $\omega_r$ (which differs from the pole angle $\omega_0$), is exactly given by the expression:

$$|H_s(\omega_r)| = \frac{1}{(1 - r^2)|\sin\omega_0|}$$

When r is close to 1, representing a large resonance, then:

$$k_1 = \frac{-2r\cos\omega_0}{1 + r^2} \approx -\cos\omega_0$$

and the gain at the resonance frequency of the standard lattice second order filter can be approximated in terms of the reflection coefficients as:

$$|H_s(w_r)| = \frac{1}{(1 - k_2)\sqrt{1 - k_1^2}} \quad (8)$$

which shows that in the direct form using the standard lattice implementation, the gain at the resonant frequency becomes arbitrarily large as $k_2 = r^2$ approaches 1. It will be shown that this is not the case for the reverse lattice implementation.

For the reverse lattice structure illustrated in FIG. 5, the transfer function of the filter can be expressed as:

$$H_r(z) = \frac{(1 - k_1^2)(1 - k_2^2)}{1 + k_1(1 + k_2)z^{-1} + k_2 z^{-2}}$$

Assuming as before, that $r \approx 1$, the numerator in the reverse lattice transfer function can be approximated by:

$$(1-k_1^2)(1-k_2^2) = (1-k_1^2)(1-k_2)(1+k_2)$$

and if $k_2$ is approximately equal to 1, the numerator becomes:

$$(1-k_1^2)(1-k_2^2) \approx 2(1-k_1^2)(1-k_2) \quad (9)$$

Multiplying the gain at the resonance frequency of the standard lattice structure, as expressed in equation (8), by equation (9), representing the numerator of the reverse lattice structure, yields the gain at the resonance frequency for the reverse lattice structure expressed as:

$$|H_r(w_r)| \approx \frac{2(1 - k_1^2)(1 - k_2)}{(1 - k_2)\sqrt{1 - k_1^2}}$$

and can be further reduced to the expression;

$$|H_r(w_r)| \approx 2\sqrt{1 - k_1^2} \approx 2|\sin \omega_0| \quad (10)$$

Expression (10) shows that the gain at the resonance frequency for the reverse lattice structure is approximately independent of the pole radius. Therefore, as long as the pole angle $w_0$ is constant, and the radius r is close to 1, the resonance gain of the reverse lattice structure remains approximately constant.

Figure 6A:
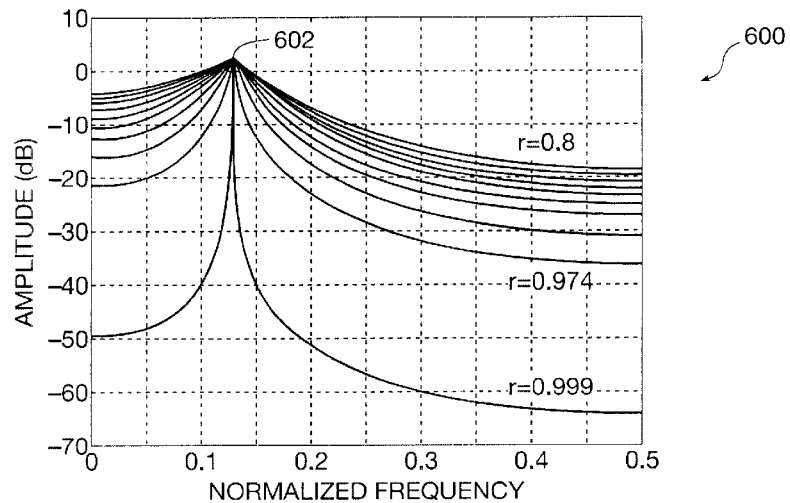
FIG. 6A is a frequency response of the IIR filter of FIG. 5.

FIG. 6A shows a frequency response 600 of the reverse lattice filter 500, as the pole radius r is varied between 0.8 and 0.99, while the pole angle $w_0$ remains fixed at $\pi/4$. The result is advantageous because there is no need for any additional scaling to avoid saturation when the pole radius is allowed to come close to 1. As the pole angle comes closer to zero, the gain at the resonant frequency becomes smaller and smaller because of the term($\sin \omega_0$) in equation (10). This is preferable to the standard lattice filter wherein, as shown by equation (8), the gain can reach extremely large values when the resonant frequency approaches zero.

Figure 6B:
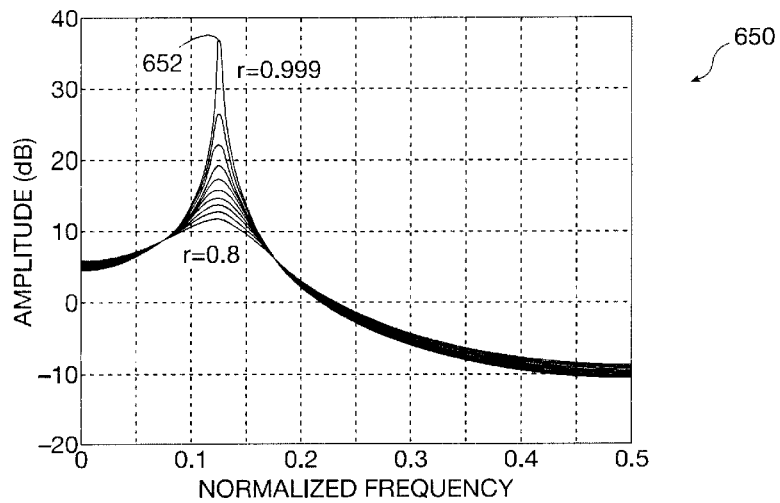
FIG. 6B is a frequency response of the IIR filter of FIG. 4.

FIG. 6B shows a frequency response 650 of the standard lattice filter 400, as the pole radius r is varied between 0.8 and 0.99, while the pole angle $w_0$ remains fixed at $\pi/4$. As can be seen, in FIG. 6A the maximum amplitude is approximately 3 dB as shown at 602, while in FIG. 6B, the maximum amplitude is approximately 37 dB as shown at 652. Thus, the reverse lattice structure yields a more desirable response.

It is also possible to selectively reverse the direction of the criss-cross signal paths in certain sections of the filter and not in others. In doing so, a mixed standard/reverse lattice filter structure is formed.

Figure 7:
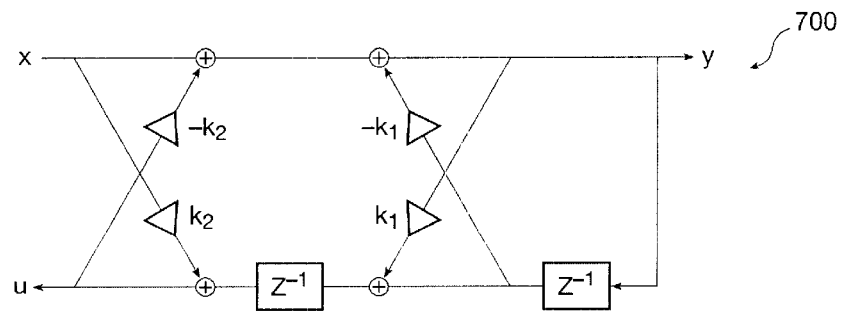
FIG. 7 is a mixed standard/reversed lattice structure filter implementation.

FIG. 7 shows an embodiment of a mixed standard/reverse lattice 700 implementation constructed in accordance with the present invention. The resulting transfer function for the mixed standard/reverse lattice 700 can be expressed as:

$$H_m(z) = \frac{\prod_{i \in E}(1-k_i^2)}{A(z)}$$

where E contains indexes of the sections whose criss-cross signal path has been reversed. For example, lattice 700 illustrates a topology for a mixed standard/reverse second-order purely recursive filter where only section 2 is reversed. The resulting transfer function can be expressed as:

$$H_m(z) = \frac{1-k_2^2}{1+k_1(1+k_2)z^{-1}+k_2z^{-2}}$$

This is a useful filter, if it is desired to scale the filter with respect to the pole radius ($r=k_2$) only, and not with respect to the pole angle $\omega_0$. As in the preceding example, the gain at the resonant frequency would still be independent of r (for r close to 1), however the absence of scaling by the term $(1-k_1^2)$ makes the filter behave like a standard second order lattice filter as the pole approaches DC. Thus, the resonance gain would not decrease, but rather increase as $\omega_0$ approaches zero.

Figure 8:
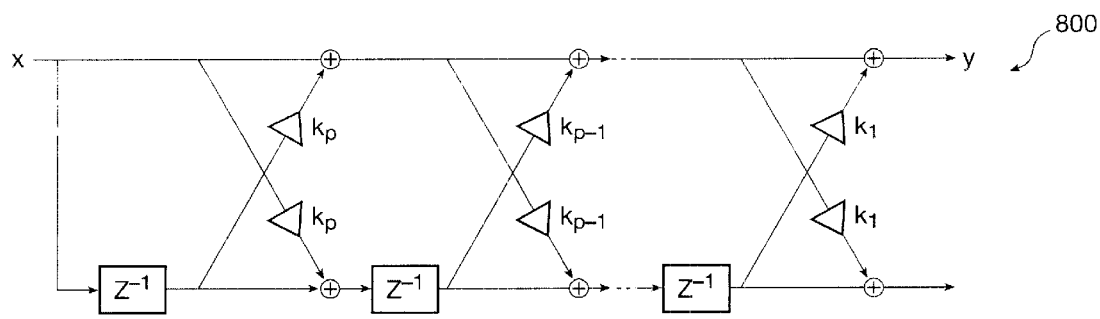
FIG. 8 is a prior art lattice structure implementation of a FIR filter.

FIG. 8 shows a prior art lattice structure used to implement a FIR filter 800. The transfer function of the FIR filter 800 can be expressed as:

$$H_s(z)=B(z)$$

where B(z) is a p-degree polynomial in $z^{-1}$, where p is the number of sections in the filter. As before, the coefficients of the polynomial B(z) can be obtained from the reflection coefficients $k_i$ via the Levinson recursion, and thus, it can be shown that the FIR filter 800 is an all-zero filter.

Figure 9:
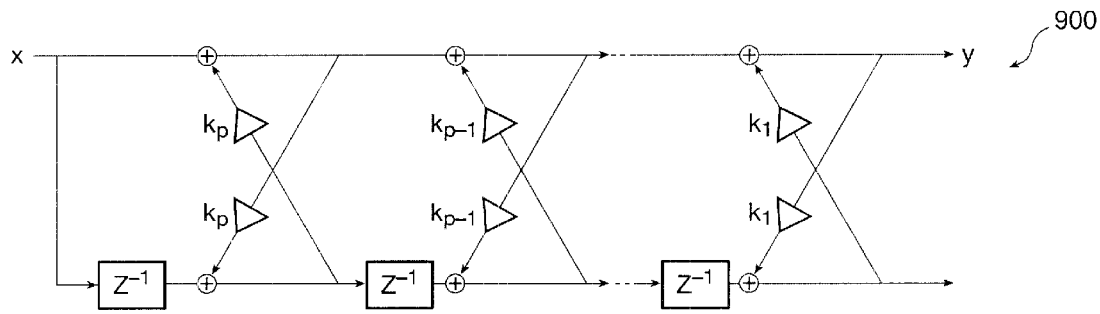
FIG. 9 is a reverse lattice structure implementation of a FIR filter constructed in accordance with the present invention.

FIG. 9 shows a reverse lattice structure used to implement a FIR filter 900 constructed in accordance with the present invention. The reverse lattice FIR filter 900 has a transfer function expressed as:

$$H_r(z) = \frac{B(z)}{\prod_{i=0}^{P}(1-k_i^2)}$$

where B(z) is the same polynomial as in the standard lattice FIR filter 800. This result is simply the inverse of the IIR case. For example, the transfer function of the reverse lattice FIR filter 900 is the transfer function of the standard lattice FIR filter 800 divided by scale factors that result from the reverse crisscross structure. As a result, the transfer function is scaled by a scale factor expressed as:

$$\frac{1}{\prod_{i=0}^{P}(1-k_i^2)}$$

which is larger than 1 and can become extremely large when the reflection coefficients approach 1 in magnitude.

Therefore, the present invention provides a new lattice structure for implementing IIR and FIR filters. For higher-order IIR filters, the automatic scaling helps reduce saturation problems resulting from the use of near-unity reflection coefficients. This desirable feature comes at no additional cost, since the reverse lattice structure requires the same number of additions, multiplications and delays as the standard lattice structure. It will be apparent to those with skill in the art that the above embodiments can be rearranged, reordered or combined in any fashion without deviating from the scope of the present invention. Accordingly, the disclosures and descriptions herein are intended to be illustrative, but not limiting, of the scope of the invention which is set forth in the following claims.

What is claimed is:

1. Reverse lattice structure for processing an input signal to form an output signal, comprising:

means to scale the input signal to form a scaled input signal;

means to delay a first feedback signal and to form a delayed feedback signal;

means to combine the delayed feedback signal with the scaled input signal to form a second feedback signal;

means to scale the second feedback signal to form a third feedback signal; and means to combine the input signal and the third feedback signal to form the output signal.

2. The reverse lattice structure of claim 1 wherein the output signal is the first feedback signal.

3. The reverse lattice structure of claim 1 wherein the reverse lattice structure forms a section and wherein a plurality of the sections are combined to form an IIR filter.

4. The reverse lattice structure of claim 3 wherein an output signal from a last section is the first feedback signal.

5. A method for processing an input signal to form an output signal, comprising;

receiving the input signal;

scaling the input signal to form a scaled input signal;

receiving a feedback signal;

delaying the feedback signal to form a delayed feedback signal;

combining the scaled input signal with the delayed feedback signal to form an adjusted feedback signal;

scaling the adjusted feedback signal to form a scaled adjusted feedback signal; and combining the input signal with the scaled adjusted input signal to form the output signal.

6. Lattice structure for processing an input signal to form an output signal, comprising:

a first summing node having logic to sum the input signal and a first criss-cross signal to produce the output signal;

a delay module having logic to receive a feedback signal and to delay the feedback signal to produce a delayed feedback signal;

a second summing node coupled to the delay module and having logic to sum the delayed feedback signal and a second criss-cross signal to produce an output feedback signal;

a first amplifier coupled between the first and second summing nodes and having logic to receive the output feedback signal and to scale the output feedback signal by a first parameter to form the first crisscross signal; and a second amplifier coupled between the first and second summing nodes and having logic to receive the input signal and to scale the input signal by a second parameter to form the second crisscross signal.

7. The lattice structure of claim 6 wherein the input feedback signal is the output signal.

8. The lattice structure of claim 6 wherein the delay module performs the function $z^{-1}$ wherein a one unit delay is provided.

9. The lattice structure of claim 6 wherein the lattice structure is a section and a plurality of sections are combined to form an IIR filter.

10. The IIR filter of claim 9 wherein the output of the last section forms the input feedback signal to the last section.

* * * * *